United States Patent [19]

Leung

[11] Patent Number: 5,045,726
[45] Date of Patent: Sep. 3, 1991

[54] LOW POWER PROGRAMMING CIRCUIT FOR USER PROGRAMMABLE DIGITAL LOGIC ARRAY

[75] Inventor: Raymond T. Leung, Palo Alto, Calif.

[73] Assignee: North American Philips Corporation, Tarrytown, N.Y.

[21] Appl. No.: 524,329

[22] Filed: May 16, 1990

[51] Int. Cl.[5] .............................................. H03K 17/12
[52] U.S. Cl. .................................. 307/466; 307/202.1; 307/446; 307/465; 365/189.01
[58] Field of Search ...................... 307/202.1, 315, 446, 307/465, 466-468, 570, 270; 340/825.27; 365/189.01, 96, 104

[56] References Cited

U.S. PATENT DOCUMENTS

| | | | |
|---|---|---|---|
| 4,192,016 | 3/1980 | Taylor | 307/465 X |
| 4,514,650 | 4/1985 | Yum | 307/467 X |
| 4,698,589 | 10/1987 | Blankenship et al. | 365/96 X |
| 4,701,636 | 10/1987 | Millhollan et al. | 307/202.1 X |
| 4,725,745 | 2/1988 | Kando et al. | 307/465 |
| 4,734,886 | 3/1988 | Blankenship et al. | 365/104 X |
| 4,879,681 | 11/1989 | Miwa et al. | 365/189.01 |
| 4,885,481 | 12/1989 | Hobbs et al. | 307/202.1 X |
| 4,887,241 | 12/1989 | Tran | 365/96 X |

FOREIGN PATENT DOCUMENTS

| | | | |
|---|---|---|---|
| 0124040 | 10/1978 | Japan | 365/96 |
| 1131210 | 11/1968 | United Kingdom | 365/96 |

*Primary Examiner*—David Hudspeth
*Attorney, Agent, or Firm*—Leroy Eason

[57] ABSTRACT

A programming circuit for an array of bipolar transistors which is selectable by row and column decoders to form a selected logic circuit, programming being effected by thermal links respectively connected to the respective transistors and which undergo a change in conductive state when subjected to a programming current of sufficient magnitude. The programming circuit includes a row driver having an FET gate which in response to a row address selection pulse turns on a bipolar transistor (Q1), the FET gate otherwise maintaining Q1 off. Transistor Q1 forms a Darlington pair with any of the transistors in the corresponding row of the array which are turned on. The transistors in respective columns of the array are connected in common by respective column conductors to respective transmission gates, each transmission gate including another Darlington bipolar pair driven by a CMOS inverter. The inverter opens the transmission gate in response to a strobe pulse which is concurrent with a column selection pulse from the column decoder, but otherwise maintains the transmission gate closed. A significant reduction in power consumption, and consequent heat dissipation, is achieved because the row drivers and transmission gates for non-selected rows and columns do not require quiescent operating current, and programming current for a selected transistor is supplied in a path comprising only bipolar Darlington pairs.

4 Claims, 2 Drawing Sheets

LOW POWER PROGRAMMING CIRCUIT FOR USER PROGRAMMABLE DIGITAL LOGIC ARRAY

BACKGROUND OF THE INVENTION

1. Field of the Invention

This invention relates to digital logic arrays of the kind which can be programmed by a user to establish a selected logic circuit configuration, and particularly to a programming circuit capable of establishing the selected circuit configuration with less power consumption, and consequent heat dissipation, than has heretofore been feasible.

2. Description of the Related Art

Many integrated circuits are available in the form of arrays of digital logic elements having various possible interconnections which are programmable by a user so as to establish a logic circuit configuration suited to his particular application. The logic elements may be diodes or transistors, and the interconnections are frequently in the form of fusible links which change from the conductive to the non-conductive state in response to a current of sufficient magnitude. The programming operation should ideally only supply current to the fusible links which are to be opened or "blown". In practice, however, due to the circuit interconnections, supplying the requisite current to such links also results in appreciable current in the other fusible links and their associated logic elements. Consequently, the power source must supply considerably more current than would be adequate for blowing only the selected links. As a result, many of the logic elements, particularly nearest to the power source, may receive, of the order of ten times their normal operating current, resulting in a substantial rise in temperature of the integrated circuit and possible damage to the logic elements therein.

Examples of user programmable digital logic arrays employing fusible links can be found in U.S. Pat. No. 4,422,072, issued Dec. 20, 1983, and U.S. Pat. No. 4,703,206, issued Oct. 27, 1987, both assigned to the present assignee. As noted in the latter patent, an alternative type of programmable connection is a so-called "anti-fuse", which is normally open but closes to create a circuit path when supplied sufficient current. In either case, programming of the array requires that substantial current be supplied to the programmable connections, typically of the order of 50mA for titanium-tungsten fusible links of the type commonly employed. One kind of logic array disclosed in such patent can be configured by programming so as to provide an array of AND/-NAND gates and OR/NOR gates. Another type of logic array described therein contains data storage flip-flops which can be configured by programming to maintain a particular logic state.

In such patents the fusible links provide connections to Schottky diodes or bipolar transistors in the array, and since blowing of a fusible link requires substantial current it has been the practice to employ bipolar transistors rather than field-effect transistors (FET's) in the programming circuit. U.S. Pat. No. 4,192,016, issued Mar. 4, 1980, discloses a user programmable logic array wherein the decoder for addressing particular rows of the array includes a bipolar transistor as well as several FET's. However, in order to blow the fusible link of a given transistor in a selected row programming current must be supplied to all transistors in that row. Thus, such array has the problem noted above of requiring excessive programming current.

SUMMARY OF THE INVENTION

The object of the present invention is to provide a programming circuit for a user programmable logic array, which programming circuit operates at relatively low power and consequently reduced heat dissipation. This is achieved by employing FET's in the programming circuit for addressing selected rows and columns of the array and employing bipolar transistors to supply the necessary programming current to change the conductive state of selected fused or anti-fused connections. The term "thermal link" will be used herein and in the appended claims to refer to either of those types of programmable connections.

A programming circuit in accordance with the invention is adapted to program a logic array of bipolar transistors of the same type conductivity (either NPN or PNP) which are arranged in rows and columns, the respective transistors in a given column being connected by respective thermal links to a common conductor for such column. The array is programmable by altering the conductive state of the thermal link of the transistor at any selected row and column address, such selection being effected by a row address decoder and a column address decoder producing concurrent selection pulses at outputs thereof corresponding to the selected row address and column address. The programming circuit comprises a plurality of row drivers which respectively connect the outputs of the row address decoder for the respective rows to all transistors in the relevant row, and a plurality of column transmission gates which respectively connect the column outputs of the column address decoder to the respective common conductors for the relevant columns.

The programming circuit is characterized in that the row driver for each row comprises a bipolar transistor (Q1) of the aforesaid conductivity type and an FET gate for coupling transistor Q1 to the relevant row output of the row address decoder, the FET gate turning transistor Q1 on in response to a row selection pulse at such row output of the row address decoder and maintaining transistor Q1 off in the absence of such a row selection pulse, transistor Q1 being connected to all of the transistors in such row so that during selection of any of the transistors therein transistor Q1 forms a first Darlington pair with the selected transistor, such Darlington pair supplying current to the thermal link of the selected transistor which alters the conductive state of such link. Each of the transmission gates comprises an FET switch having a control terminal connected to the relevant column output of the column address decoder and which in response to a column selection pulse at such column output causes the FET switch to turn on and thereby provide a supply voltage at an output terminal thereof. A CMOS inverter coupled to the FET switch receives the supply voltage therefrom, such inverter having a control terminal for receiving a programming strobe pulse and an output at which the inverter produces a control voltage which changes during reception of a strobe pulse at its control terminal. A second Darlington pair of bipolar transistors has an input coupled to the output of the inverter to receive the control voltage therefrom, and an output connected to the common conductor for the relevant column, such control voltage rendering the second Darlington pair conductive during reception of a strobe pulse and otherwise maintaining such Darlington pair non-conductive.

In operation, programming current for the thermal link of a selected transistor is provided during a strobe pulse by the two Darlington pairs of bipolar transistors, while the Darlington pairs associated with non-selected transistors are maintained non-conductive. In addition, the row drivers and transmission gates for non-selected rows and columns of the array do not require quiescent operating current.

BRIEF DESCRIPTION OF THE DRAWINGS

A more complete description of the invention is presented below with reference to the accompanying drawings in which.

DESCRIPTION OF THE PREFERRED EMBODIMENTS

Figure 1:
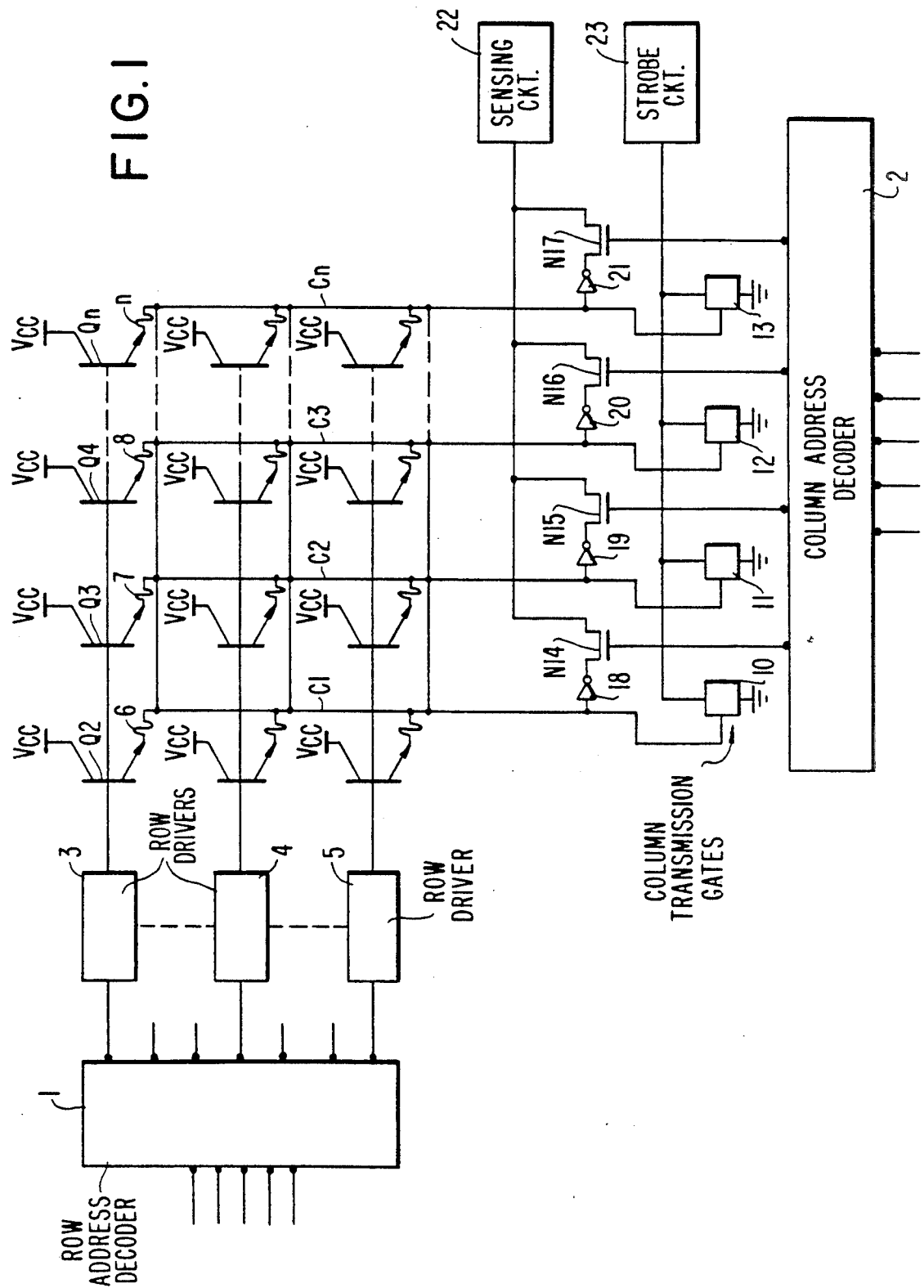
FIG. 1 is a block diagram of a programmable logic array having a programming circuit connected thereto in accordance with the invention.

Referring to FIG. 1, there is shown an integrated circuit array comprising a plurality of bipolar transistors arranged in respective rows and columns. A given row is addressed by row address decoder 1, and a given column is addressed by column decoder 2. Such decoders are combinational logic circuits well known in the art, each providing a logic signal at one of the plurality of outputs selected in accordance with a binary address signal supplied to the inputs of the decoder. Either positive or negative logic can be employed, FIG. 1 being drawn for the case of positive logic so that a logic "0" corresponds to low or ground potential and a logic "1" corresponds to a more positive potential. To simplify the drawing, only a few of the output lines from row address decoder 1 are actually illustrated since all are connected to the array transistors in the same way. Also, only four columns of the array are illustrated, although it may have many more. The respective outputs of row address decoder 1 are connected to respective row driver circuits, such as 3, 4 and 5, which are shown in more detail in FIG. 2 and constitute part of the complete programming circuit. The first row of the array, driven by row driver 3, comprises a succession of bipolar NPN transistors Q2, Q3, Q4, Qn, each of which has its base connected to the output of driver 3. The remaining rows of the array each comprise a succession of bipolar NPN transistors as in the first row, the bases of which are connected to the output of the driver for the relevant row. Thus, the corresponding transistors in successive rows form successive vertical columns. The emitters of the array transistors in the first row are respectively connected to respective fusible links 6, 7, 8, n. Similarly, the emitters of the array transistors in succeeding rows are respectively connected to respective fusible links.

The column address decoder 2 has respective outputs connected to the respective column conductors of the array, each such output being connected to its column conductor by a transmission gate. Thus, transmission gates 10, 11, 12 and 13 respectively serve to provide a return to ground for the respective column conductors C2, C3, C4, Cn which define the columns of the array, each column conductor being connected in common to the fusible links of the array transistors in such column. The transmission gates cooperate with the row drivers to select a particular array transistor for programming of its fusible link. Such a transmission gate circuit is shown in more detail in FIG. 2. The respective outputs of column address decoder 2 are further connected to the gates of respective FET's N14, N15, N16, N17, such FET's being respectively connected in series between the outputs of respective CMOS inverters 18, 19, 20, 21, and the input of a sensing circuit 22. The inputs of inverters 18, 19, 20, and 21 are respectively connected to the respective column conductors C2, C3, C4, Cn.

In operation, if for example the condition of fusible link 7 of transistor Q3 is to be sensed, and assuming that such link is closed (i.e., conductive), the current supplied to the input of inverter 19 from column conductor C2 and originating from row driver 3 when the relevant row is addressed, is conducted to the source of FET transistor N15. Since the gate of transistor N15 receives a logic "1" signal from column address decoder 2, a current will be supplied from the drain of transistor N15 to sensing circuit 22. It thereby detects a "0" signal, signifying that transistor Q3 has a closed link. If fusible link 7 were open, then when transistor Q3 is addressed no row selection current will be present in column conductor C2 and so a "1" will be detected by sensing circuit 22. Such sensing circuits are conventional in the art, and may include a display to provide visual indication of the status of the fusible link of any of the array transistors Q2, Q3, Q4, Qn which are addressed. The programming circuit in FIG. 1 also includes a strobe circuit 23, which is a clock pulse generator providing a clock pulse to each of column transmission gates 10, 11, 12 and 13 when programming and sensing of the array are to be effected.

Figure 2:
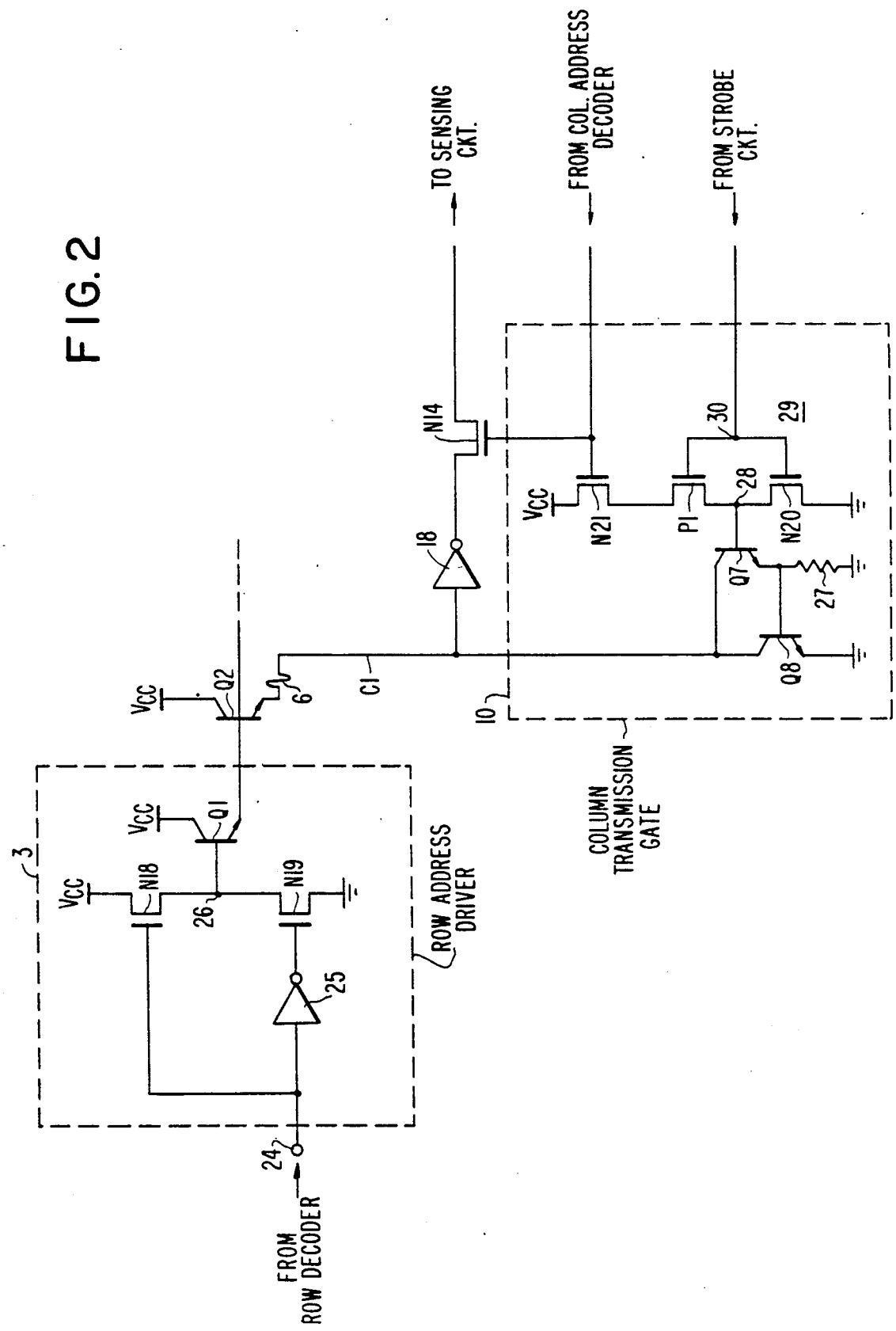
FIG. 2 is a more detailed circuit diagram of the programming circuit in FIG. 1.

Referring now to FIG. 2, there is shown a programming circuit constituted by a row driver and transmission gate as in FIG. 1. Specifically, row driver 3 and transmission gate 10 for selection of array transistor Q2 in the first column and the first row of the array in FIG. 1. It is presumed that a "1" logic signal is present for such row at the output of row address decoder 1 in FIG. 1 to signify selection of such row. Such logic signal, constituting a row selection pulse, is supplied to input 24 of row driver 3, which input is connected to the gate of an FET transistor N18. Transistor N18 is in series with a second FET transistor N19 between a positive supply voltage source $V_{cc}$ and ground. Designation of FET transistors herein as "N" or "P" is employed to signify whether they are N or P channel FET's. Input 24 of the row driver is also connected to a CMOS inverter 25, the output of which is connected to the gate of FET transistor N19. In operation, a row selection pulse at row driver input terminal 24 will turn transistor N18 on and transistor N19 off, producing a "1" logic signal at the junction 26 of both transistors. The junction 26 is connected to the base of an NPN bipolar transistor Q1, which is thereby turned on. When row driver 3 is not addressed, its input 24 will be at ground potential and so FET transistor N18 will remain off. Due to inverter 25, FET transistor N19 will then be on and will bring junction 26 to ground potential, thereby maintaining transistor Q1 in the off state. Thus, no current or power is supplied by row driver 3 when its row is not addressed.

The emitter of transistor Q1 constitutes the output of row driver 3, and it is connected in common to the base of the array transistor Q2 which is to be addressed as well as to the bases of all transistors in that row of the array in FIG. 1, thus forming a Darlington transistor pair with any of such transistors which is conductive. A Darlington pair provides high current gain, so that the requisite current for blowing the fusible link of any selected array transistor is provided without drawing appreciable current from the row address decoder.

Turning now to the transmission gate 10 in FIG. 2, it also comprises a Darlington pair of NPN bipolar transistors Q7 and Q8, the input thereto being at the base of Q7, a current transmission path to ground being provided from the collector to the grounded emitter of Q8. Both collectors are connected to the array column conductor C1 which is connected to fusible link 6 of array transistor Q2. The emitter of transistor Q7 drives the base of transistor Q8, and also is connected to ground by a resistor 27, which may be a few hundred ohms, to achieve faster turn-off of Q8 when Q7 turns off. The base of transistor Q7 is connected to the output 28 of a conventional CMOS inverter 29 comprising complementary FET transistors P1 and N20, the source of N20 being grounded. The drain of N20 is connected to that of P1, and the gates of N20 and P1 are both connected to a terminal 30 which constitutes the input terminal of the transmission gate and to which the programming strobe pulse from strobe circuit 23 in FIG. 1 is supplied. Operating voltage for the CMOS inverter is obtained from power supply $V_{cc}$, which is connected to the source of FET device P1 by way of a further FET transistor N21 the gate of which constitutes the input terminal of the transmission gate 10 for the column selection pulse produced by column decoder 2 in FIG. 1.

In operation, the selection pulse from the column address decoder turns FET transistor N21 on, thereby providing operating voltage from supply $V_{cc}$ to the source of FET transistor P1 in the inverter circuit 29. When a strobe "0" pulse is received at input 30 of inverter 29 it turns FET transistor P1 on and turns FET transistor N20 off. A positive control voltage is therefore produced at inverter output 28, which is supplied to the base of bipolar transistor Q7 in the Darlington pair including transistor Q8. Such pair is thereby rendered conductive, and "sinks" or conducts to ground the current in column conductor C1 supplied as described above by row driver 3. Upon termination of the "0" strobe pulse the gates of FET transistors P1 and N20 of the inverter will be returned to the "1" logic level, thereby turning transistor P1 off and turning transistor N20 on. As the source of transistor N20 is at ground, this brings its drain to ground and so the control voltage at terminal 28 will be brought to ground potential. It therefore turns transistor Q7 off, and so transistor Q8 is also turned off. Since the strobe pulse cannot turn transistor P1 on unless transistor N21 is also on, and since that only occurs when a selection pulse is supplied from the column address decoder, it will be apparent that transmission gate circuit 10 prevents any appreciable current in non-addressed transistors in the array in FIG. 1. In addition, although appreciable current is required for blowing the fusible link of a selected array transistor, that is supplied with very little current drawn from the row address decoder.

While the invention has been described with reference to specific preferred embodiments thereof, it will be apparent to those skilled in the art that various modifications and adaptations thereof may be made without departing from the essential teachings and scope of the present invention as defined in the ensuing claims.

What is claimed is:

1. A programming circuit for a user programmable logic array of bipolar transistors of the same conductivity type and which are arranged in rows and columns, the respective transistors in a given column being connected by respective thermal links to a common conductor for such column; the array being programmable by altering the conductive state of the thermal link of the transistor at any selected row and column address, such selection being effected by a row address decoder and a column address decoder producing concurrent selection signals at outputs thereof corresponding to the selected row and column addresses; said programming circuit comprising a plurality of row drivers which respectively connect the outputs of the row address decoder for the respective rows to all transistors in the relevant row and a plurality of column transmission gates which respectively connect the column outputs of the column address decoder to the respective common conductors for such columns; characterized in that:

the row driver for any row comprises a bipolar transistor (Q1) of said conductivity type and a FET gate for coupling transistor Q1 to the relevant row output of the row address decoder, said FET gate turning transistor Q1 on in response to a row selection pulse at said row output of the row address decoder and maintaining transistor Q1 off in the absence of such a row selection pulse, transistor Q1 being connected to all of the transistors in said row so that during selection of any of the transistors in such row transistor Q1 forms a first Darlington pair with the selected transistor, said Darlington pair supplying current to the thermal link of the selected transistor which alters the conductive state of such thermal link; and the transmission gate for any column comprises
  an FET switch having a control terminal connected to the relevant column output of the column address decoder and which in response to a column selection signal at said column output causes said FET switch to turn on and thereby provide a supply voltage at an output terminal thereof;
  a CMOS inverter coupled to said FET switch to receive said supply voltage therefrom, said inverter having a control terminal for receiving a programming strobe pulse and an output at which said inverter produces a control voltage which changes in response to a strobe pulse at said control terminal; and
  a second Darlington pair of bipolar transistors having an input coupled to the output of said inverter to receive said control voltage therefrom, and an output connected to said common conductor for said column, said control voltage rendering said second Darlington pair conductive during said strobe pulse and otherwise maintaining said second Darlington pair non-conductive.

2. A programming circuit as claimed in claim 1, further comprising respective FET switches for the respective columns of said array, each such FET switch having a control terminal coupled to the relevant column output of the column address decoder to receive a column selection signal therefrom, an input coupled to the common conductor for such column to detect current therein, and an output at which such FET switch produces an output signal when current is present in said common column conductor and a column selection signal is concurrently supplied to said control terminal.

3. A programming circuit as claimed in claim 1, further characterized in that said row address driver for any row comprises a pair of FET transistors of the same conductivity type and which are connected in series between a source of supply voltage and ground, said FET transistors having a common output terminal at the junction thereof, the control terminals of said FET transistors being coupled to the relevant row output of said row address decoder so that a row selection pulse at such output causes said FET transistors to produce an output signal at said common output terminal thereof, said FET transistors maintaining said common output terminal substantially at a reference potential except when a row selection signal is present at said row output of said row address decoder.

4. A programming circuit as claimed in claim 3, wherein said row driver for any row is further characterized in that the control terminal of a first of said pair of FET transistors is directly connected to the relevant row output of the row address decoder, and the control terminal of a second of said pair of FET transistors is connected to such output of said row address decoder by a CMOS inverter.

* * * * *